United States Patent [19]

Fukunaga

[11] Patent Number: 5,247,248
[45] Date of Patent: Sep. 21, 1993

[54] BURN-IN APPARATUS AND METHOD OF USE THEREOF

[75] Inventor: Satoru Fukunaga, Tenri, Japan

[73] Assignee: Sharp Kabushiki Kaisha, Osaka, Japan

[21] Appl. No.: 832,696

[22] Filed: Feb. 7, 1992

[30] Foreign Application Priority Data

Feb. 18, 1991 [JP] Japan .................................. 3-023450

[51] Int. Cl.⁵ .......................... G01R 1/06; G01R 31/02
[52] U.S. Cl. .............................. 324/158 F; 324/158 P
[58] Field of Search ............. 324/158 R, 73.1, 158 R; 437/8; 29/593, 827; 439/68, 69, 70, 90; 361/385, 412, 413, 414

[56] References Cited

U.S. PATENT DOCUMENTS

| | | | |
|---|---|---|---|
| 4,636,726 | 1/1987 | Santomango et al. | 324/158 F |
| 4,871,963 | 10/1989 | Cozzi | 324/158 R |
| 4,926,117 | 5/1990 | Nevill | 324/158 F |
| 4,985,988 | 1/1991 | LIttlebury | 324/158 R |
| 5,008,614 | 4/1991 | Shreeve et al. | 324/158 F |
| 5,086,269 | 2/1992 | Nobi | 324/158 F |

FOREIGN PATENT DOCUMENTS 59-76456  5/1984  Japan .
61-1897   1/1986  Japan .

*Primary Examiner*—Vinh Nguyen

[57] ABSTRACT

In order to improve the operability of a burn-in apparatus, to shorten the operating time, to reduce the number of the components, and to increase the package density of semiconductor integrated circuits to be accommodated within a burn-in apparatus, semiconductor integrated circuits with a lead frame are mounted on a first wiring board by means of fixing the pressuring member to the first wiring board with a magnetic force. Thereafter, the first wiring board is mounted to a second wiring board, and both are to be inserted into a burn-in apparatus.

7 Claims, 10 Drawing Sheets

BURN-IN APPARATUS AND METHOD OF USE THEREOF

FIELD OF THE INVENTION

The present invention relates to a burn-in apparatus for applying heat or electrical stress to a semiconductor integrated circuit before final testing thereof to cause an early life failure, and the present invention and further pertains to a method of use thereof.

BACKGROUND OF THE INVENTION

It is known that although the early failure occurrence rate of semiconductor integrated circuits is high, the failure occurrence rate after the occurrence of such an early life failure decreases. Therefore, burn-in testing is performed by applying heat or electrical stress to semiconductor integrated circuits prior to shipment testing to cause such an early life failure thereto.

FIG. 7 is a perspective view of a conventional burn-in board 2. Equally spaced on a board 4 of the burn-in board are a plurality of semiconductor integrated circuit sockets 5 and resistors 6, each of the semiconductor integrated circuit sockets 5 being secured with a plurality of screws 7 on the board 4 of the burn-in board. Formed in the semiconductor integrated circuit socket 5 is a contact electrode 9 which is made of elastic conductive materials and corresponds to a lead 8 of an elemental semiconductor integrated circuit 1. In addition, a guide post 10 is mounted for locating the lead 8 of the elemental semiconductor integrated circuit 1 in relation to the contact electrode 9. Further, a cover 11 is pivotally fixed to one end of the semiconductor integrated circuit socket 5.

When the cover 11 is securely closed on the semiconductor integrated circuit socket 5 provided with the elemental semiconductor integrated circuit 1, the cover 11 will press the lead 8, being placed on the contact electrode 9 in a contacting manner therewith, of the elemental semiconductor integrated circuit 1 against the elasticity of the contact a electrode 9, so that contact pressure can be obtained. A projecting lead pressuring section 12 is provided on the inside face of the cover 11 to press the lead 8 of the elemental semiconductor integrated circuit 1. Further, the cover 11 has a locking lever 13. The locking lever 13 is a lock lever which is disposed for keeping the cover 11 securely closed. Mounted in a location on the integrated circuit socket 5 corresponding to that of the locking lever 13 is a locking portion 14.

In the semiconductor integrated circuit sockets 5 and the covers 11, package escape openings 16 are formed in the corresponding locations to package sections 15 made of resin and ceramic of the elemental semiconductor integrated circuit 1. The semiconductor integrated circuit socket 5 and the guide post 10 are integrally formed and mounted. Also, the cover 11 and the lead pressuring section 12 are integrally formed and mounted. All of these components are made from the same materials having electrical insulating characteristics.

A connector terminal 18 is formed at one end of the burn-in board 2. Via the connector terminal 18, a burn-in apparatus 3 to be described later is connected to the burn-in board 2. The connector terminal 18 and the contact electrode 9 are connected, via a plurality of fuses 17 and resistors 6, with each other by a pattern electrode (not shown).

Next, the elemental semiconductor integrated circuit 1 is placed on the semiconductor integrated circuit socket 5 in such a way that the lead 8 of the elemental semiconductor integrated circuit 1 fits to the contact electrode 9. At this time, the alignment of the lead 8 of the elemental semiconductor integrated circuit 1 with the contact electrode 9 is automatically made by means of the guide post 10 on the semiconductor integrated circuit socket 5. Because the package escape opening 16 is provided in the semiconductor integrated circuit socket 5, the package section 15 enters the package escape opening 16 so that the lead 8 will come into contact with the contact electrode 9.

Further, the cover 11, having the lead pressing section 12 corresponding to the lead 8 of the elemental semiconductor integrated circuit 1, is closed in the direction of the arrow B. At this time, the locking lever 13 of the cover 11 and the corresponding locking portion 14 of the semiconductor integrated circuit socket 5 are engaged with each other so that the cover 11 is kept securely closed. Also, provided in the cover 11 is another package escape opening 16. As the contact electrode 9 has elasticity, the lead 8 of the elemental semiconductor integrated circuit 1 is pressed by the cover 11 so that a reliable contact is established.

FIG. 8 is a perspective view of a conventional burn-in apparatus 3. A plurality of burn-in board racks 19 are equally spaced within the burn-apparatus 3. The burn-in boards 2 each carrying a plurality of the semiconductor integrated circuits 1 are accommodated in order in the burn of board racks 19 in the burn-in apparatus 3. The burn-in board 2 has the connector terminal 18. Each card edge type connector (not shown) is mounted in the respective inner parts of the burn-in board racks 19 for establishing circuit connections with the connector terminal 18, the number of which is equal to the number of the burn-in boards 2. Accordingly, the circuitry connection between the burn-in board 2 and the burn-in apparatus 3 will be automatically established when the burn-in board 2 is accommodated in the burn-in board rack 19. As a result, the circuit connection between the semiconductor integrated circuits 1 and the burn-in apparatus 3 is made. After burn-in testing is completed, the semiconductor integrated circuits 1 are taken out from the burn-in apparatus 3 in the reverse order of the accommodation step and then are forwarded to the next process of shipment testing.

FIG. 9 is a view showing one example of electrical signals to be input to the lead 8 of the semiconductor integrated circuit 1 during burn-in testing. Either a power supply potential Vcc, a ground potential GND or a synchronization signal CLK is input via the resistor 6 to the lead 8 which functions as an input terminal or a power supply terminal. This is because the input signals are controlled by the resistor 6 to a required level corresponding to the lead 8 so as to allow a variety of the semiconductor integrated circuits 1 to be tested by burn-in testing which employs only a single burn-in apparatus 3. Consequently, as many of the resistors 6 the leads 8 functioning as an input terminal are required. This has resulted in a defect that the area occupied by the resistors 6 becomes greater. Accordingly, the packaging density of the semiconductor integrated circuits 1 decreases.

With the semiconductor integrated circuits 1, they are different not only in size and in external circuit configuration but also in location of input/output terminals and power supply terminals depending on their type. Therefore, it is necessary to prepare the semiconductor integrated circuit socket 5 for each of the semiconductor integrated circuits 1. In addition, it is required that the burn-in board 2 suitable for the semiconductor integrated circuit socket 5 must be produced, which will lead to complicated problems such as the number of components for the semiconductor integrated circuit socket 5 and the burn-in board 2 increases. This drawback is one of the main factors leading to high costs in mass production processes.

In addition to the above problems, it is necessary that the mounting of the semiconductor integrated circuit 1 on the semiconductor integrated circuit socket 5 and the locking of the cover 11 are carried out for every semiconductor integrated circuit. Therefore, after burn-in testing is completed, the cover 11 must be opened for the installation and removal operations of the individual semiconductor integrated circuits 1. Accordingly, the mounting and removal operations of the semiconductor integrated circuit 1 to the burn-in board 2 become complicated. This causes another problem such as the installation and removal operations require a much longer amount of time.

FIG. 10 is a plan view illustrating the semiconductor integrated circuit 1 having semiconductor integrated circuit supporting sections 21 under production. The semiconductor integrated circuit 1, which includes the package section 15 and the leads 8, is connected to a lead frame 20 via lead tips 22 as shown with hatching. The semiconductor integrated circuit 1 is also connected to the lead frame 20 through the semiconductor integrated circuit supporting section 21. Tie-bars 23, as shown with hatching, are provided between the individual leads 8 and each of the leads 8 is connected with one another by the tie-bars 23.

FIG. 11 is a flow chart showing the manufacturing process of the semiconductor integrated circuit 1. The process a1 is a die bonding step of fixing semiconductor integrated circuit chips to the lead frame 20. Next, the process a2 is a wire bonding step wherein the integrated circuit chips are connected to the leads 8. The process a3 is a package sealing step which performs a sealing by using the package section made of resin or ceramic.

In the process a4, each semiconductor integrated circuit 1 is cut away from the lead frame 20 by cutting the lead tip 22, the tie-bar 23 and the semiconductor integrated circuit supporting section 21. Further, in the process a5, the lead 8 of the semiconductor integrated circuit 1 is to be bent. The process a6 is to "burn-in" the semiconductor integrated circuit 1 with the burn-in board 2 and the burn-in apparatus 3. In the final process a7, after burn-in testing is completed another testing is given to the semiconductor integrated circuit 1.

Alternatively, in the process a4, it is possible to cut only the lead tip 22 and the tie-bar 23 without cutting the semiconductor integrated circuit 1 from the lead frame 20 to leave the semiconductor integrated circuit 1 in a connecting relation to the lead frame 20 through the semiconductor integrated circuit supporting section 21. Where the semiconductor integrated circuit 1 is left in a connecting relation to the lead frame 20, there is no need of the installing and removing operations of the individual semiconductor integrated circuit 1 to the semiconductor integrated circuit socket 5 so that such installation and removal operations may be easily carried out. However, neither the integrated socket 5 nor the burn-in board 2 capable of "burning-in" the semiconductor integrated circuit 1, which is still in a connecting relation to the lead frame 20, is now available. Accordingly, the step of burn-in testing is forced to be skipped, or it is necessary to employ another burn-in method for individually installing and removing the semiconductor integrated circuit 1 by means of the burn-in board 2. In the event that burn-in testing on the semiconductor integrated circuit 1 is skipped, it is possible that the failure occurrence rate of the semiconductor integrated circuits 1 may increase after shipment. As a result, the problem that the reliability of the semiconductor integrated circuits 1 declines will arise.

SUMMARY OF THE INVENTION

It is the principal object of the invention to provide a burn-in apparatus that has an improved operability, gives a greater packaging density of semiconductor integrated circuit elements mounted on a second wiring board, and has the flexibility to the second wiring board.

It is another object of the invention to provide a burn-in method using the burn-in apparatus identified above that has an improved operability.

The present invention relates to a burn-in apparatus, the burn-in apparatus including a mounting member comprising a first wiring board on which a plurality of mounting locations for arranging each of semiconductor integrated circuit elements therein are set and pressuring members which are stuck to the first wiring board by a magnetic force so as to fasten the semiconductor integrated circuit elements wherein at least either of the first wiring board or the pressuring members is selected according to the type of the semiconductor integrated circuit elements; a second wiring board on which a plurality of the mounting members are mounted so that they erect with their own ends; and an apparatus housing which accommodates the second wiring board for performing burn-in testing.

Furthermore, the present invention pertains to a burn-in method of employing the burn-in apparatus, the method comprising the steps of preparing a semiconductor integrated circuit member wherein a plurality of semiconductor integrated circuit elements are connected to supporting members and lead terminals project from the semiconductor integrated circuit elements; arranging the semiconductor integrated circuit member in such a way that each of the semiconductor integrated circuit elements is mounted in the respective mounting locations set on the first wiring board; fixing the semiconductor integrated circuit member onto the first wiring board by means of sticking the pressuring member to the first wiring board with a magnetic force; mounting a plurality of the mounting members, to which the semiconductor integrated circuit member is secured, on the second wiring board with each end of the mounting members in an erecting manner; placing the second wiring board with the mounting members in the burn-in apparatus housing; and performing burn-in testing on the semiconductor integrated circuit elements.

The burn-in apparatus in accordance with the present invention comprises mounting members, a second wiring board and an apparatus housing. The mounting member has a first wiring board and a pressuring member where at least either one is to be selected depending on the type of the semiconductor integrated circuit elements. On the first wiring board, a plurality of the mounting locations for arranging each of the semiconductor integrated circuit elements therein are set. The pressuring members, which are stuck to the first wiring board by a magnetic force, fastens the semiconductor integrated circuit elements on the first wiring circuit.

The mounting member corresponding to a variety of the semiconductor integrated circuit elements is mounted in the second wiring board, with one end of the mounting member in an erect manner from the second wiring board.

The second wiring board is accommodated within the burn-in apparatus housing where burn-in testing is performed.

According to the present invention, the semiconductor integrated circuit member, in which a plurality of the semiconductor integrated circuit elements are connected to the supporting members and the leads project from each of the semiconductor integrated circuit elements, is prepared.

Initially, the semiconductor integrated circuit member is arranged so that each of the semiconductor integrated circuit elements is mounted in the respective mounting locations set on the first wiring board. Next, the semiconductor integrated circuit member is secured to the first wiring board by means of sticking the pressuring member to the first wiring board with a magnetic force. A plurality of the mounting members, to which the semiconductor integrated circuit members are secured, are mounted to the second wiring board, with one end of the mounting member in an erect manner from the second wiring board. Finally, the second wiring board provided with the mounting members is placed in the burn-in apparatus housing for burn-in testing.

According to the present invention, the operability of the burn-in apparatus will be improved and the operating time is also shortened by using the pressuring member for sticking the semiconductor integrated circuit elements to the first wiring board with a magnetic force. Furthermore, the packaging density of the semiconductor integrated circuit elements to be mounted on the second wiring board becomes greater by mounting the mounting member on the second wiring board in an erect manner. By selecting the mounting member depending on the type of the semiconductor integrated circuit elements, the flexibility of the second wiring board is improved, resulting in the and a decrease in the number of the components to be used results.

Furthermore, in virtue of the use of the semiconductor integrated circuit member to which a plurality of the semiconductor integrated circuit elements are connected, the operability of the burn-in method of employing the burn-in apparatus is improved and the operating time can be shortened.

BRIEF DESCRIPTION OF THE DRAWINGS

Other and further objects, features, and advantages of the present invention will be more explicit from the following detailed description taken with reference to the drawings wherein.

DETAILED DESCRIPTION OF THE PREFERRED EMBODIMENTS

Figure 1:
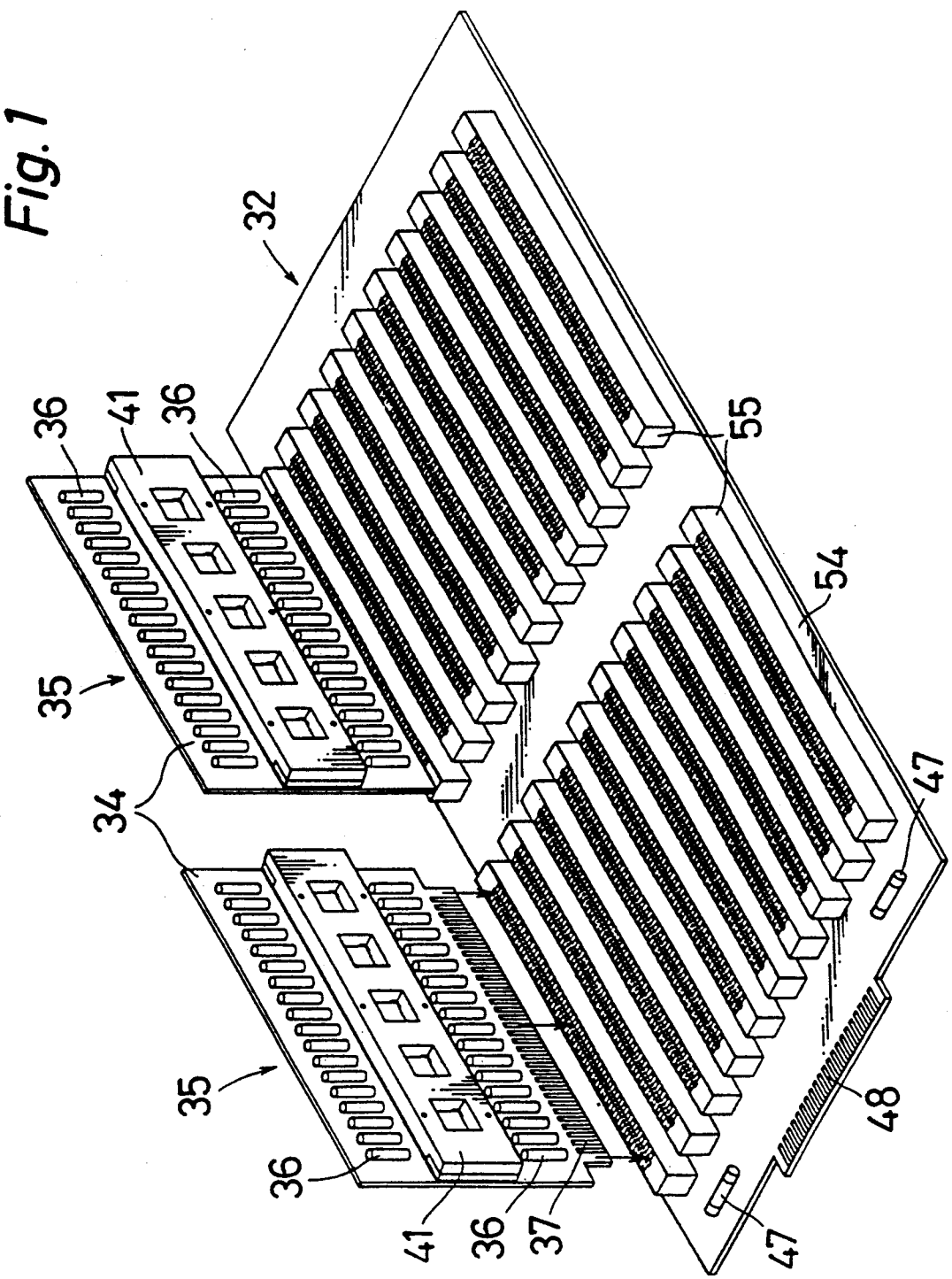
FIG. 1 is a perspective view of an embodiment in accordance with the present invention showing a second wiring board 32 and a first wiring board 35.

Now referring to the drawings, the preferred embodiments of the present invention are described below.

Figure 2:
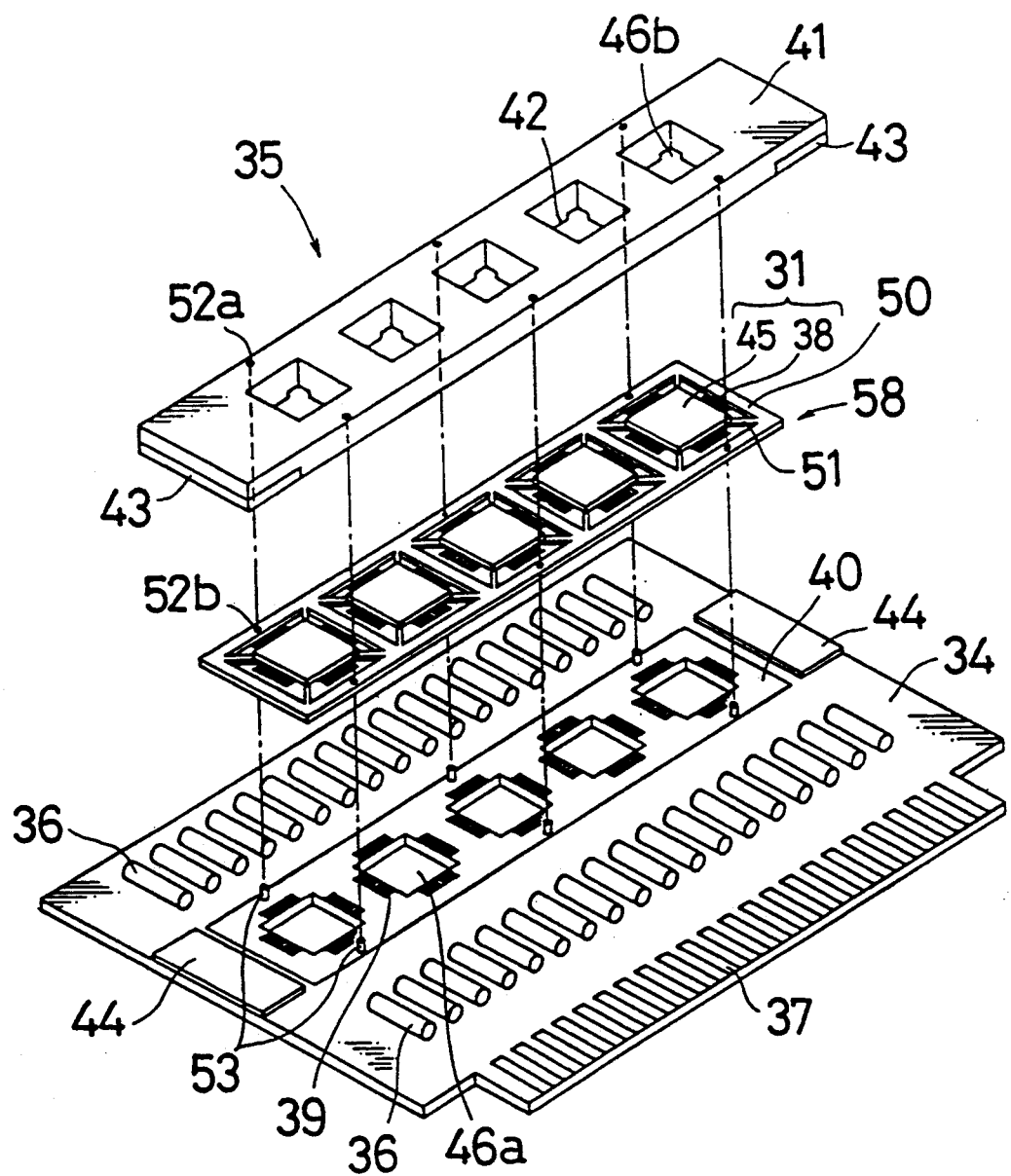
FIG. 2 is an exploded perspective view of the first wiring board 35 of FIG. 1.
Figure 3:
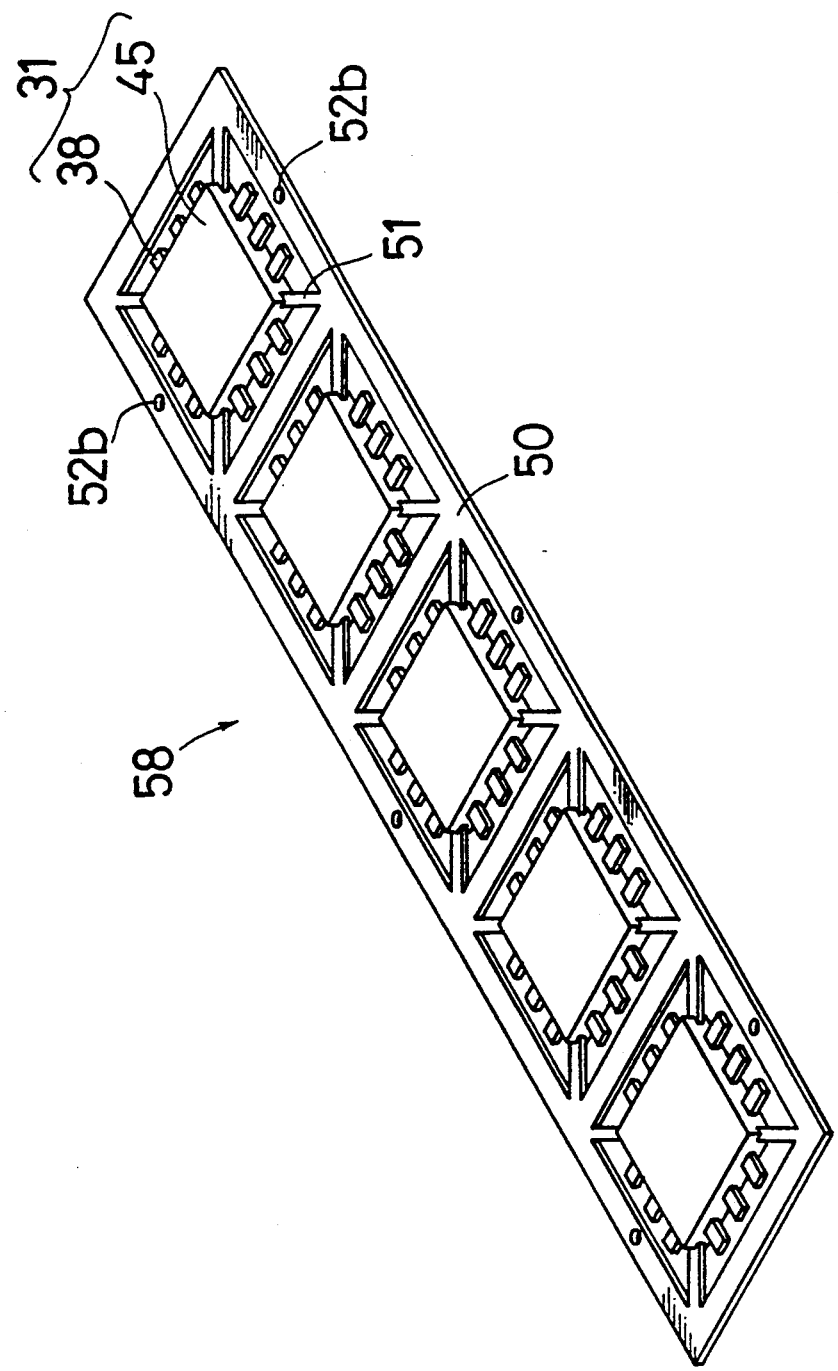
FIG. 3 is a perspective view of an semiconductor integrated circuit 58 with a lead frame of FIG. 2.
Figure 4:
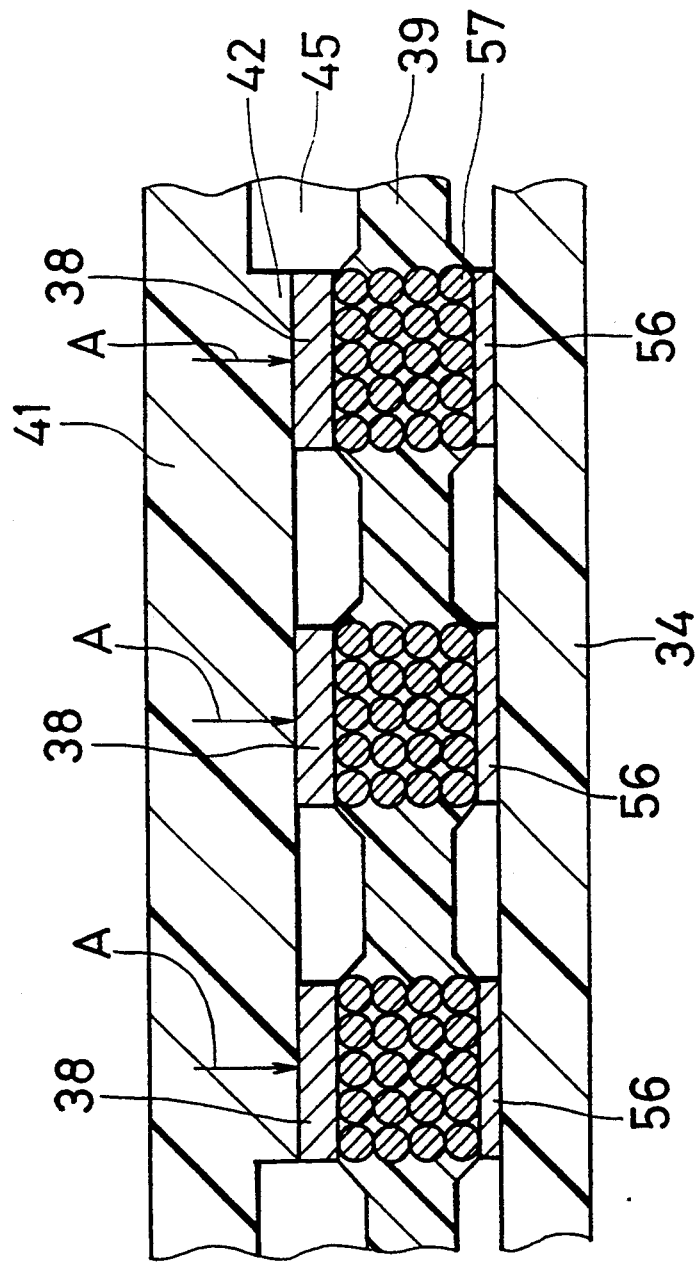
FIG. 4 is an enlarged sectional view of the first wiring board 35 of FIG. 1.

FIG. 1 is a perspective view of an embodiment according to the present invention showing a second wiring board 32 together with a first wiring board 35. FIG. 2 is an exploded perspective view of the first wiring board 35 as shown in FIG. 1. FIG. 3 is a perspective view of a semiconductor integrated circuit 58 with a lead frame of FIG. 2. FIG. 4 is an enlarged view of the first wiring board 35 as shown in FIG. 1.

As shown in FIG. 2, a pressure conductive rubber sheet 40 is disposed on a socket board 34 of the first wiring board 35 functioning as a mounting member. In the socket board 34, a plurality of locating pins 53 are mounted in a plurality of openings (not shown) in an erect manner. In the pressure conductive rubber sheet 40, another plurality of openings (not shown), each location of which corresponds to respective locating pins 53, are provided in such an arrangement that each of a plurality of pattern electrodes 56 to be described later, which is formed on the socket board 34, is connected with each contact electrode 39, to be described later, of the pressure conductive rubber sheet 40. Accordingly, locating can be easily made by inserting the locating pins 53 into these openings provided in the pressure conductive rubber sheet 40.

On the socket board 34, two rows of resistors 36 are arranged with the pressure conductive rubber sheet 40 inbetween. Furthermore, provided on both sides of the pressure conductive rubber sheet 40 are iron plates 44.

As an semiconductor integrated circuit member, the semiconductor integrated circuit 58 with the lead frame 50 is placed on the pressure conductive rubber sheet 40. In the semiconductor integrated circuit 58 with the lead frame 50 is shown in FIG. 3, a plurality of the semiconductor integrated circuits 31 processed by lead cut and tie-bar cut are mounted on the lead frame 50. These semiconductor integrated circuits 31 are supported by means of a plurality of the semiconductor integrated circuit supporting sections 51 which connect the four corners of the package section 45 made of resin or ceramic to the lead frame 50.

On the pressure conductive rubber sheet 40, the contact electrode 39 is formed in the corresponding location to that of the lead 38 of the semiconductor integrated circuit 31. In order to connect the lead 38 with the contact electrode 39, package escape openings 46a are provided in the pressure conductive rubber sheet 40 and the socket board 34 in the locations corresponding to those of the semiconductor integrated circuit package sections 45, allowing the semiconductor integrated circuit package sections 45 to enter the package escape openings 46a. The lead frame 50 has locating openings 52b positioned in the corresponding locations to those of the locating pins 53 in order to connect each lead 38 with the corresponding contact electrode 39. In this manner, locating is easily performed by inserting the locating pins 53 into the locating openings 52b.

Placed on the semiconductor integrated circuit 58 with the lead frame 50 are covers 41 which function as a pressuring member and are made of electrical insulating materials. Package escape openings 46b are provided in the covers 41, each of the package escape openings 46b being positioned to correspond to each of the package sections 45 of the semiconductor integrated circuits 31 for allowing the package sections to enter the package escape openings 46b. In addition, the cover 41 has a lead pressuring section 42 in the form of a rectangular flat-face projection in the corresponding location to the lead 38. Furthermore, the cover 41 has permanent magnets 43 in the locations corresponding to the iron plates 44 which are mounted on the socket board 34.

The cover 41 is also provided with a plurality of locating openings 52a positioned in the locations corresponding to the locating pins 53 so that locating is easily performed by simply inserting the locating pins 53 into the locating openings 52a.

Therefore, as described above, the alignment of the pressure conductive rubber sheet 40, the semiconductor integrated circuit 58 with the lead frame 50 and the cover 41 will be easily made on the socket board 34 by means of the locating pins 53. At this time, the iron plates 44 are attracted to stick to the permanent magnets 43 by a magnetic force.

It is illustrated in FIG. 4 that the pattern electrodes 56 are formed on the socket board 34 and are positioned in the locations corresponding to the leads 38. The contact electrode 39 is placed over the pattern electrode 56. In the corresponding location to the pattern electrode 56, the contact electrode 39 is provided in a vertically projecting form. Metallic particles 57 are unevenly distributed within the projecting portions of the contact electrode 39. Placed on the pattern electrode 56 is the lead 38 onto which the lead pressuring section 42 is then loaded. At this time, as mentioned above, the cover 41 is stuck to the socket board 34 by a magnetic force so that the leads 38 are pressed by the lead pressuring section 42 in the direction of the arrow A. Consequently, elastic deformation occurs to the contact electrode 39 which is made of elastic rubber so that the metallic particles 57 which are unevenly distributed within the contact electrode 39 are linked together. Thus, the lead 38 and the pattern electrode 56 are now connected with each other via the metallic particles 57.

Referring to FIG. 2, a connector terminal 37 is formed at one end of the socket board 34 and the pattern electrode 56 is pattern-formed from both sides of the connector terminal 37 to the connecting location through the contact electrode 39 and through the resistor 36.

Next, referring to FIG. 1, a plurality of card edge type connectors 55 are mounted on a burn-in board 54 of the second wiring board 32. The first wiring board 35 having the aforesaid construction is vertically mounted on the second wiring board 32 by inserting the connector terminal 37 to the card edge type connector 55.

A plurality of fuses 47 are placed on the burn-in board 54. Further, another connector terminal 48 is provided at one end of the burn-in board 54. From both sides of the connector terminal 48, the pattern electrode (not shown) is formed and is connected via the fuses 47 to the card edge type connector 55.

Figure 5:
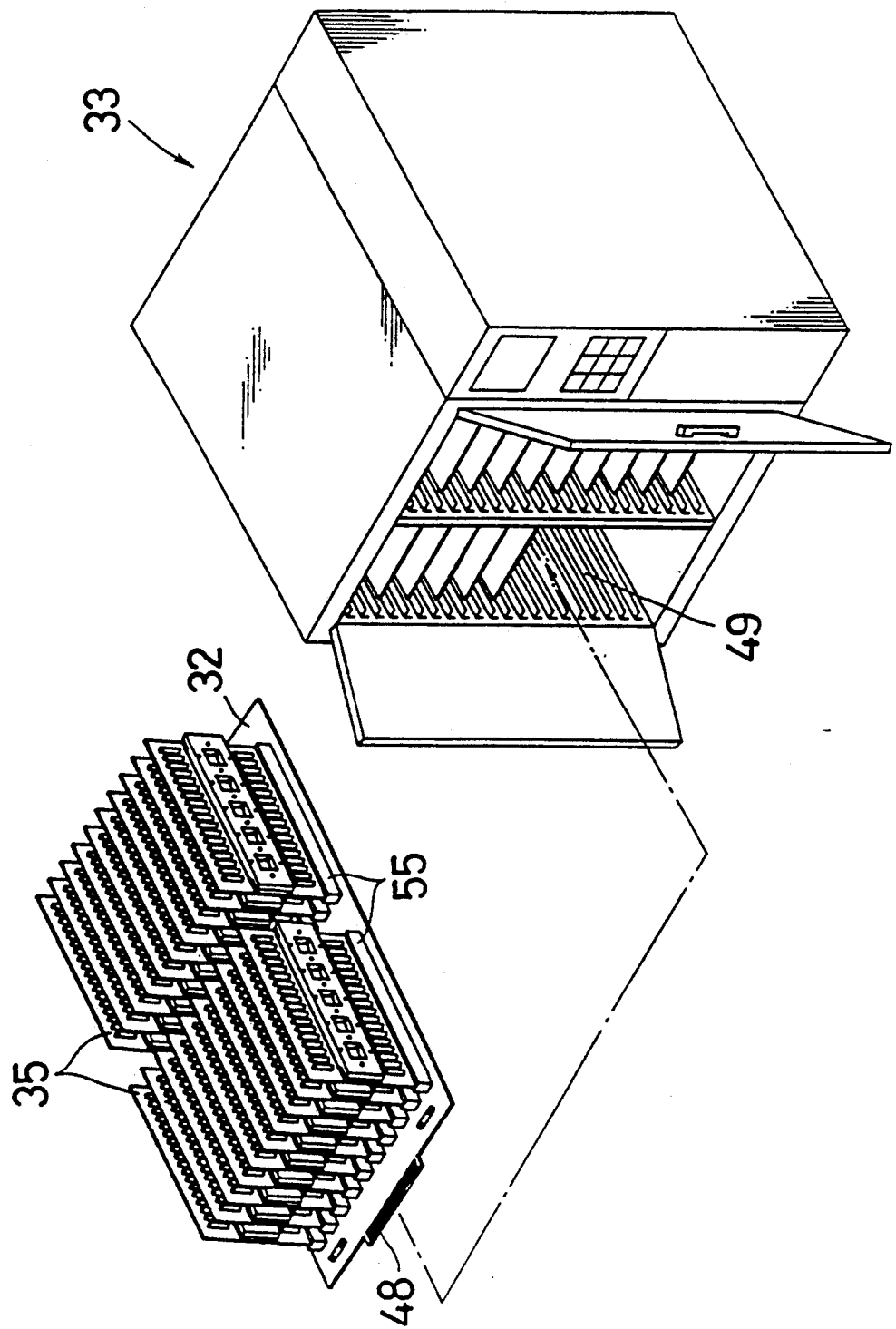
FIG. 5 is a perspective view of an embodiment illustrating a burn-in apparatus 33 in accordance with the present invention.

FIG. 5 is a perspective view of a burn-in apparatus 33 in an embodiment in accordance with the present invention. Within the burn-in apparatus 33, a plurality of burn-in board racks 49 are equally spaced. Each second wiring board 32 with a plurality of the first wiring boards 35 is accommodated in order on each of the burn-in board racks 49 in the burn-in apparatus 33. When the second wiring board 32 is accommodated on the burn-in board rack 49, the connector terminal 48 of the second wiring board 32 is inserted into another card edge type connector (not shown) in the inner part of the burn-in board rack 49. Consequently, the burn-in in apparatus 33 is connected with the second wiring board 32. Accordingly, both circuits of the burn-in apparatus 33 and semiconductor integrated circuits 31 are connected with each other.

Figure 6:
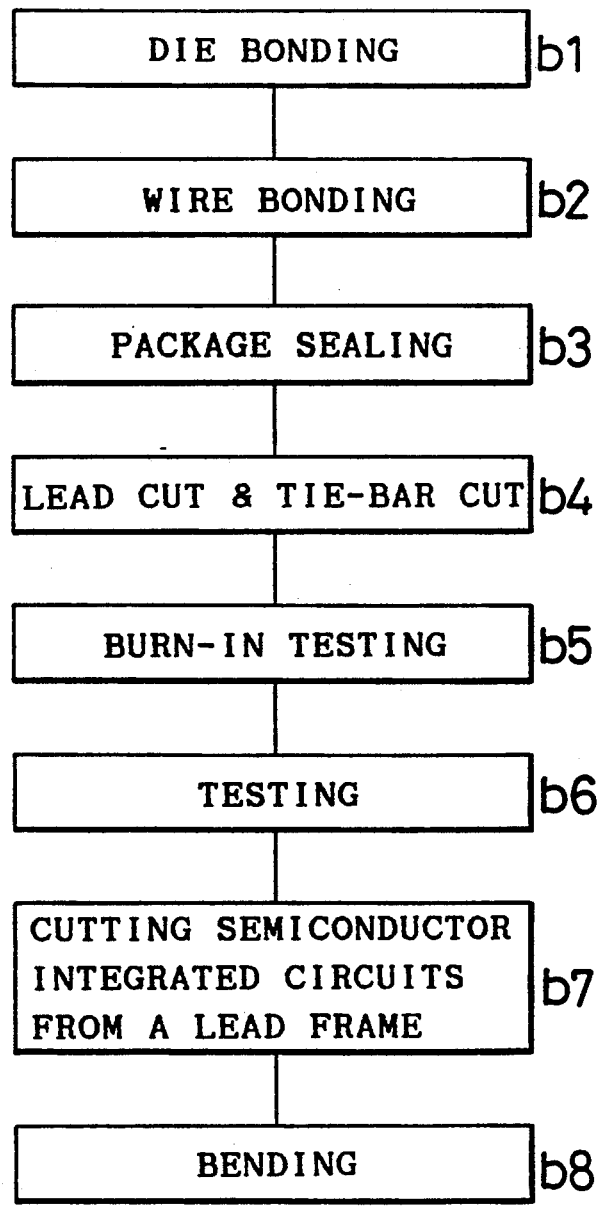
FIG. 6 is a flow chart showing a manufacturing process of semiconductor integrated circuits 31 which employs the burn-in apparatus 33 as one of the embodiments of the present invention.
Figure 7:
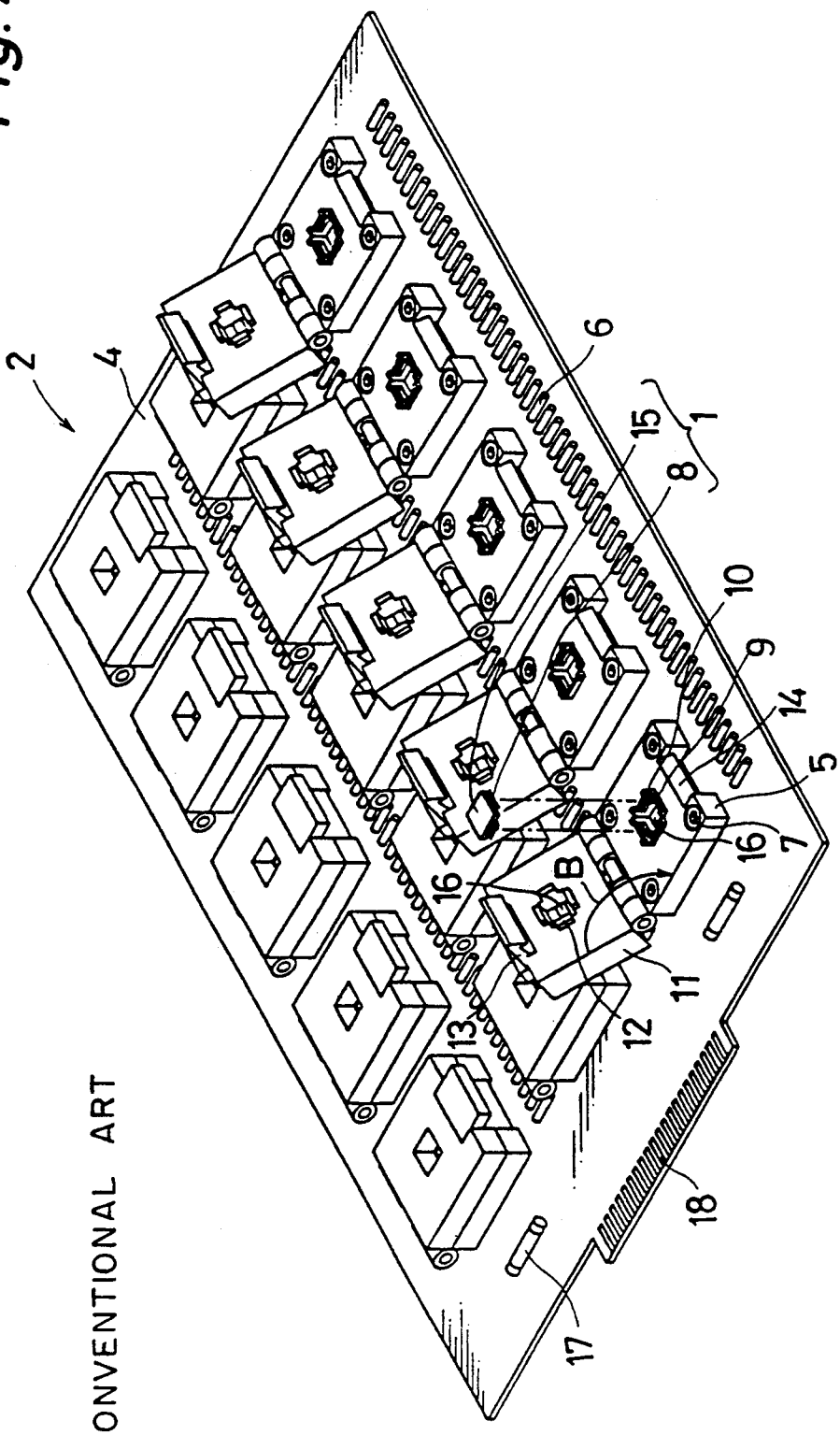
FIG. 7 is a perspective view showing a conventional burn-in board 2.
Figure 8:
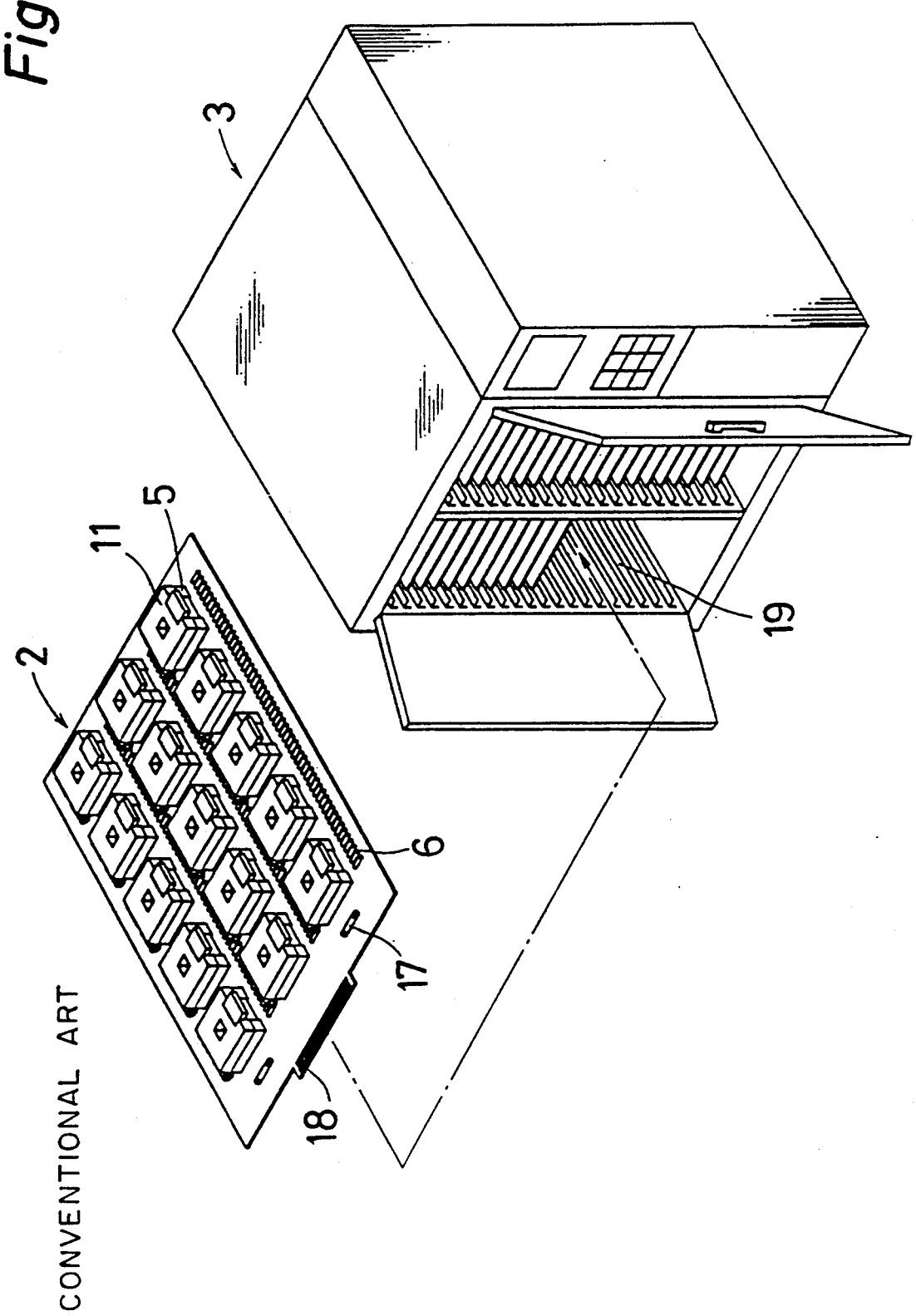
FIG. 8 is a perspective view of a conventional burn-in apparatus 3.
Figure 9:
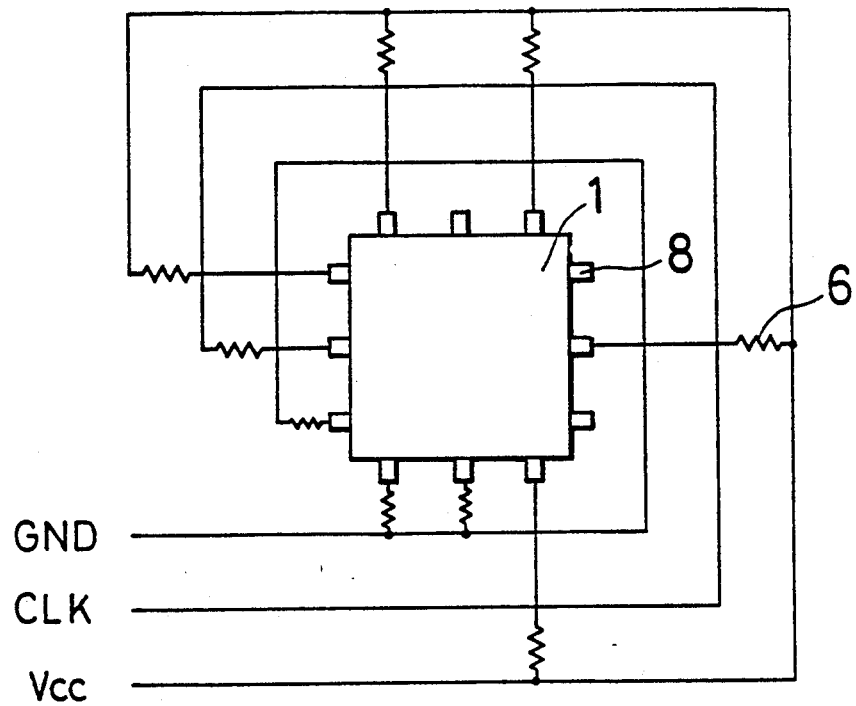
FIG. 9 is a diagram showing an example of electric signals input to the lead 8 of the semiconductor integrated circuit 1 during burn-in testing.
Figure 10:
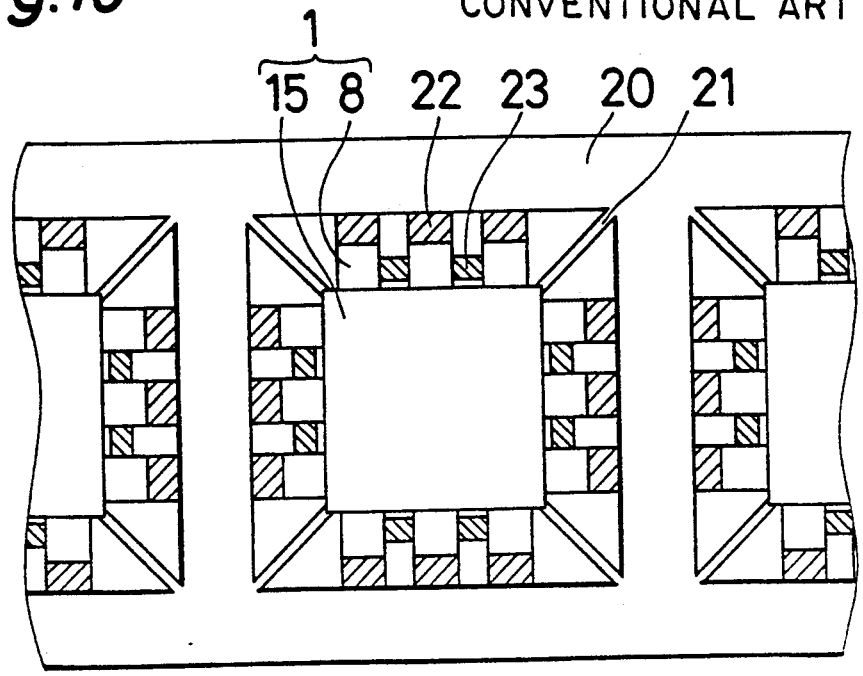
FIG. 10 is a plan view showing the semiconductor integrated circuit 1, under production, having semiconductor integrated circuit supporting sections 21.
Figure 11:
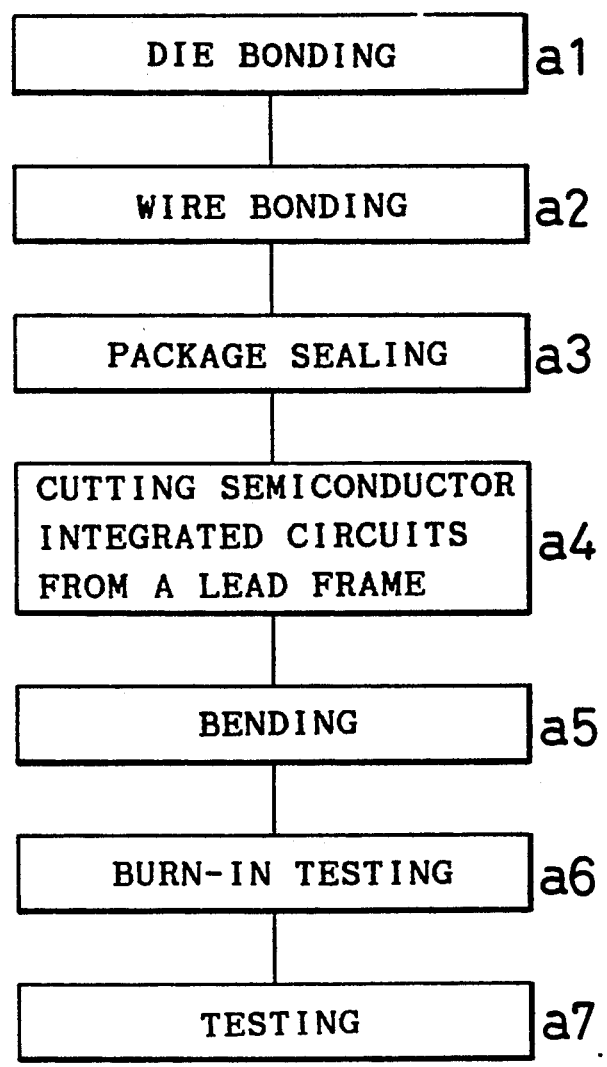
FIG. 11 is a process diagram illustrating a manufacturing process of the semiconductor integrated circuit 1.

FIG. 6 is a flow chart showing a manufacturing process of the semiconductor integrated circuits 31 employing a burn-in apparatus 33 as one of the embodiments of the present invention. The process b1 is a die bonding step of fixing semiconductor integrated circuit chips to the lead frame 50. Next, the process b2 is a wire bonding step where the semiconductor integrated circuit chip is connected to the lead 38. The process b3 is a sealing package step of performing sealing by means of a package made of resin or ceramic. In the process b4, a lead cut and a tie-bar cut are performed to produce the semiconductor integrated circuit 58 with the lead frame 50. In the process b5, the aforesaid first wiring board 35 having the semiconductor integrated circuit 58 with the lead frame is to be mounted on the second wiring board 32 and then the second wiring board 32 is placed on the burn-in apparatus 33 for performing burn-in testing. In the process b6, after burn-in testing, each semiconductor integrated circuit 31 is tested. Then, in the process b7, the semiconductor integrated circuit 31 is cut away from the lead frame 50. In the process b8, the lead 8 is bent to complete the semiconductor integrated circuit 31.

According to the embodiment of the present invention described above, signals, which are input from the card edge type connector (not shown) within the burn-in apparatus 33 to the connector terminal 48 of the second wiring board 32, are input via the pattern electrode (not shown) formed in the second wiring board 32 from the card edge type connector 55 to the connector terminal 37 of the first wiring board 35. Depending on the type of the semiconductor integrated circuit 31, the configuration of the semiconductor integrated circuit 31, the number of the leads 38, and the type and condition of the signals input to the lead 38 during burn-in are all subject to change. Dealing with a variety of semiconductor integrated circuits 31 is achieved by employing the first wiring board 35 which corresponds to a variety of the semiconductor integrated circuits 31, that is, to deal with the above is accomplished by predetermining signals which are output from each of the terminals of the card edge type connectors 55 mounted on the second wiring board 32 and by forming the pattern electrode 56 of the first wiring board 35 which corresponds to the terminal depending on the type of the semiconductor integrated circuits 31. Accordingly, because only a single type of the second wiring 32 board is required, there is no need to prepare a different second wiring board 32 for each semiconductor integrated circuit 31. Furthermore, the flexibility of the second wiring board 32 will increase, and a decrease in the number of the components will result.

By mounting, the first wiring board 35 on the second wiring board 32 in an erect manner, the necessity of mounting a resistor on the second wiring board 32 is thereby eliminated. In addition, because the area of the second wiring board 32 occupied by the semiconductor integrated circuits 31 decreases due to the aforesaid mounting manner of the first wiring board 35, the packaging density of the semiconductor integrated circuits 31 which are to be connected with the first wiring board 35 will become higher.

Furthermore, as burn-in testing on semiconductor integrated circuits 31 is performed without cutting them from the lead frame 50, the installation and removal operations of a plurality of the semiconductor integrated circuits 31 can be made to the first wiring board 35 at the same time, and an improvement of the operability in burn-in testing results and the operating time also decreases. In addition, because a plurality of the semiconductor integrated circuits 31 are supported on the lead frame 50, the number of the components necessary for mounting the semiconductor integrated circuits 31 will decrease.

With the testing after burn-in testing, as a plurality of the semiconductor integrated circuits 31 can be installed and removed on and from a test device at the same time, the operability of testing will be improved and the testing time will be shortened.

Furthermore, the mounting of the semiconductor integrated circuit 58 with the lead frame 50 on the first wiring board 35 is made by a magnetic force so that the installation and removal operations can be easily performed, the operability can be improved, and the operating time can be shortened.

Consequently, the flexibility of the second wiring board 32 is improved, and the packaging density of the semiconductor integrated circuit elements to be mounted on the second wiring board 32 becomes higher. Furthermore, as the operability of burn-in testing is improved, it is possible to shorten the time for burn-in testing.

In an embodiment in accordance with the present invention, five semiconductor integrated circuits 31 are supported on the lead frame 50. However, it is assumed that the number of the semiconductor integrated circuits 31 to be supported on the lead frame 50 may be modified to another. Also, in the present embodiment, the semiconductor integrated circuit 31 is provided with nine leads 38. It is, however, understood that the number of the leads 38 may not be limited to such a number. Although, in the present embodiment, the semiconductor integrated circuit 31 is supported by the semiconductor integrated circuit supporting sections 51 at the four corners of the package section 45, the number of the semiconductor integrated circuit supporting sections 51 and the mounting locations thereof may not be limited to such. Furthermore, although the number of the locating openings 52 provided on each components of the first wiring board 35 is set to five, such a number may be modified to another and may be selected depending on the desired positioning accuracy. According to the number thus selected, the number of the locating pins 53 may be selected.

In the present embodiment, the semiconductor integrated circuit 58 with the lead frame 50 is mounted on the first wiring board 35. However, it may be possible to mount the semiconductor integrated circuit 31 without the lead frame 50 on the first wiring board 35. Also, it may be possible to perform testing on the semiconductor integrated circuits 31 which have already been cut away from the lead frame 50 after burn-in testing.

In accordance with the present embodiment, the metallic particles 57 are unevenly distributed within the contact electrode 39 in relation to both the lead 38 and the pattern electrode 56. However, it may be possible to unevenly distribute the metallic particles 57 throughout the pattern electrode 56.

In the present embodiment, the flat package type semiconductor integrated circuits are used for describing the semiconductor integrated circuits 31. However, a dual line semiconductor integrated circuit and similar circuits may be used as the semiconductor integrated circuit 31, in which case the first wiring board 35 should be prepared according to the type of the semiconductor integrated circuits 31.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A burn-in apparatus comprising:
   a plurality of mounting members, each of said mounting members including,
      a first wiring board having a plurality of mounting locations for arranging and setting therein each of a plurality of semiconductor integrated circuit elements, and
      pressuring member which is attracted and fixed to the first wiring board by a magnetic force so as to fasten the semiconductor integrated circuit elements wherein at least either of the first wiring board or the pressuring member is selected according to the type of the semiconductor integrated circuit elements;
   a second wiring board on which said plurality of mounting members are mounted with one end thereof in an erect manner from the second wiring board; and
   a housing apparatus for burn-in testing which accommodates the second wiring board.

2. A burn-in apparatus according to claim 1 wherein said plurality of semiconductor integrated circuit elements, which include a lead frame, are disposed on the first wiring board.

3. A burn-in apparatus according to claim 2 wherein each of said mounting members further comprises a plurality of locating openings and locating pins provided on said first wiring board for positioning and aligning said lead frame and said pressuring member on said first wiring board.

4. A burn-in apparatus according to claim 1 wherein the mounting locations for disposing said plurality of integrated circuit elements on said first wiring board are made up of a pressure conductive rubber sheet disposed over the first wiring board.

5. A burn-in apparatus according to claim 1 wherein the semiconductor integrated circuit elements to undergo burn-in testing comprise flat package type semiconductor integrated circuit elements.

6. A burn-in apparatus according to claim 1 wherein the semiconductor integrated circuit elements to undergo burn-in testing comprise dual line type semiconductor integrated circuit elements.

7. A burn-in method comprising the steps of:
(a) preparing a semiconductor integrated circuit member wherein a plurality of semiconductor integrated circuit elements are connected to a supporting member and lead terminals project from the semiconductor integrated circuit elements;
(b) arranging the semiconductor integrated circuit member in such a way that each of the semiconductor integrated circuit elements is mounted in a respective mounting location set on the first wiring board;
(c) fixing the semiconductor integrated circuit member onto the first wiring board by a pressuring member with a magnetic force;
(d) mounting a plurality of mounting members, to which the semiconductor integrated circuit member is secured, to the second wiring board with one end of each of the mounting members in an erect manner;
(e) placing the second wiring board with the mounting members in a burn-in apparatus housing; and
(f) performing a burn-in testing on the semiconductor integrated circuit elements.

* * * * *